United States Patent
Meckler et al.

(10) Patent No.: US 6,873,161 B1
(45) Date of Patent: Mar. 29, 2005

(54) METHOD AND DEVICE FOR DETECTING ACCIDENTAL ARCS

(75) Inventors: Peter Meckler, Hohenstadt/Pommelsbrunn (DE); Peter Steffen, Erlangen (DE); Stefan Kohler, Rödental (DE); Ho Wilson, Seattle, WA (US)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 10/276,770
(22) PCT Filed: May 20, 2000
(86) PCT No.: PCT/EP00/04582
§ 371 (c)(1), (2), (4) Date: Nov. 19, 2002
(87) PCT Pub. No.: WO01/90767
PCT Pub. Date: Nov. 29, 2001

(51) Int. Cl.[7] .......................... H01H 9/50; G01R 31/08
(52) U.S. Cl. .................. 324/536; 324/512; 324/520
(58) Field of Search ............................. 324/536, 512, 324/520, 542, 543

(56) References Cited

U.S. PATENT DOCUMENTS 4,710,708 A * 12/1987 Rorden et al. ......... 324/207.26
5,561,605 A    10/1996 Zuercher et al. ............ 364/483
6,625,550 B1 *  9/2003 Scott et al. ................... 702/58

FOREIGN PATENT DOCUMENTS

DE    40 29 141 A    3/1992
EP    0 639 879 A    2/1995

* cited by examiner

Primary Examiner—N. Le
Assistant Examiner—John Teresinski
(74) Attorney, Agent, or Firm—Henry M. Feiereisen

(57) ABSTRACT

The invention relates to a method for detecting accidental arcs (arc tracking) on a cable (1), especially on a cable of an aircraft electrical system. According to said method, an alternating current signal (I(t)) that has been detected is sampled time-discretely and a trigonometric function (I(k)) imitating the alternating current characteristic is determined by interpolation of a number of sampling values (y(k)). The current alternating frequency ($\omega$) is then derived from this trigonometric function. The result of a comparison of the current alternating current frequency ($\omega$) and a set or reference frequency ($\omega'$) is used to determine the presence of an accidental arc ($I_{SA}$, $I_{GA}$) and a warning signal ($S_{arc}$) is optionally generated. A device which functions according to this method is advantageously integrated into a circuit-breaker (7) for the aircraft electrical system, so that the latter is equipped to detect and deactivate accidental arcs that occur on the electrical system cable (1).

14 Claims, 4 Drawing Sheets

METHOD AND DEVICE FOR DETECTING ACCIDENTAL ARCS

BACKGROUND OF THE INVENTION

The invention relates to a method for detecting accidental arcs on a cable, especially on a cable of an on-board electrical system of an aircraft or spaceship. It further relates to a device for carrying out the method. The term accidental arc relates hereby in particular to the so-called arc tracking.

The problem of the so-called "cable arc tracking" is known for many years in particular in electrical systems of aircrafts and/or spaceships. Arc tracking involves the establishment of a conducting connection in a bunched cable between two neighboring cables as a consequence of, e.g., damages and/or contaminations (wet arc tracking) or scraping on a metallic edge (dry arc tracking). This connection can be initially highly resistive (wet arc tracking) or may also be directly low resistive (dry arc tracking). Wet arc tracking designates hereby between two defects in insulation a conductive connection which is made by an electrolyte, e.g., a cleaning liquid, and attacks the cable insulation. In conjunction with arc formation, the result is oftentimes a thermal destruction of the entire bunched cable along a certain length. In contrast thereto, a metallic conductor produces the conducting connection in dry arc tracking with relatively low resistance, and the arc is practically established instantly. This may also lead to the thermal destruction of the bunched cable.

The destruction of the bunched cable per se is not the only problem here. Rather, consequential damages are critical as a result of surrounding material being set on fire. Such cable fires lead to ensuing explosion-like faults, which may be the cause for catastrophic damages to the aircraft or spaceship.

When investigating the causes of occurring accidental arcs or arc tracking in cables of such electrical systems, it could be demonstrated that the resistance capability of cable insulations against arc tracking depends exclusively on the materials used for the cable sheath, on the one hand. On the other hand, the material (POLYIMIDE) used heretofore is characterized by a very high water absorption so that damage as a result of cracking in the insulation, especially during frequent temperature changes as occurring during flight operation, is promoted. Furthermore, the thermal destruction results in a formation of carbonized deposits at about 800° C. and thus enables the arc tracking, i.e. a further migration of the arc along the cable harness. In contrast thereto, materials such as, for example, POLYTETRAFLUOROETHYLENE (PTFE) are relatively resistant against arc tracking.

Since the insulation of the cable types used in aviation are further made of POLYIMIDE film, all efforts undertaken so far in this field are directed to develop tests which allow a substantially unambiguous classification of cables as far as their resistance capability against arc tracking is concerned. Hereby, POLYIMIDE has not been used so far as component of cable sheathing because of its superior dielectric values and its high temperature resistance. Still, despite optimization of the processes and application of highest care during manufacture and laying of the bunched cable, accidents could not entirely be prevented as a result of cable arc tracking. Moreover, it has been recognized that flashover can occur in plug-type connectors under the influence of moisture and dirt, leading in the most unfavorable case to an ignition of neighboring parts.

The installation of protective measures is complicated by the fact that the amplitude of the current flowing during the arc tracking process, in particular during wet arc tracking, can lie significantly below the nominal current of typically installed protective overcurrent devices so that the latter can no longer be tripped. In contrast thereto, the amplitude values during dry arc tracking are higher as known per se. They occur, however, typically in intervals so that the converted energy is oftentimes insufficient to trigger the installed protective members.

To overcome the described problem, it is therefore desirable to provide an additional protection against accidental arcs in addition to the already existing conventional overcurrent protection in the electrical system of such an aircraft in order to protect the existing on-board installations as reliable as possible.

SUMMARY OF THE INVENTION

It is therefore the object of the invention to provide a particularly suitable method for recognizing accidental arcs on a cable, in particular on a cable of an on-board electrical system of an aircraft or spaceship. Furthermore, a device should be provided which is suitable to carry out the method and allows in a simple and in particular space-saving manner a particularly reliable protection of a cable or bunched cable and/or of a consumer supplied therewith even against accidental arcs (arc tracking).

According to one aspect of the present invention, in a method for detecting accidental arcs (arc tracking) on a cable, especially on a cable of an on-board electrical system of an aircraft, an ascertained alternating current signal is sampled time-discretely and a trigonometric function imitating the alternating current course is determined by interpolation of a number of sampling values, from which the actual alternating current frequency is derived, whereby the presence of an accidental arc can be inferred from the result of a comparison of the actual alternating current frequency ($\omega$) with a desired frequency.

Hereby, a detected alternating current signal is sampled time-discretely and a trigonometric function imitating the alternating current course is determined by interpolation of preferably only a small number of sampling values. Through comparison of the actual alternating current frequency with a reference or desired frequency, and accidental arc can be derived therefrom to, optionally, generate a warning signal. The reference or desired frequency is hereby the generated alternating current frequency, i.e. in the preferred application the on-board frequency or half the on-board system frequency. It is also possible to predetermine a critical frequency which is derived from the desired frequency and which exceeds the generated alternating current frequency, for example, by more than ten percent.

The invention is based on the recognition that in the presence of an arc or arc tracking a respective spurious signal is superimposed over a signal guided over the supply line within the bunched cable, i.e. a sinusoidal or cosinusoidal alternating current signal, wherein in view of a breach in the signal through continuous quenching and re-ignition of the arc each half signal wave has a characteristic frequency portion above the one nominal frequency with which the on-board electrical system is operated. The arc tracking signal is contained in the detected measuring signal in the form of signal spikes or peaks which can occur at different locations of the positive and/or negative half wave of the following measuring signal described as cosine signal. Since such superimpositions or disturbances as a result of arc tracking can be recognized essentially in the current signal and to a lesser degree in the voltage signal, the measurement of the current signal is suitable.

The invention is based on the contemplation that a continuous measuring signal, whose signal course is sampled time-discretely by means of an A/D converter, can be imitated from only few values or sampling values according to the formulation:

$$y(t) = y\,\text{max}\cdot\cos(\omega t)$$

$$\omega tl = -\arccos\frac{y(tl)}{y\text{max}}$$

$$\omega tr = -\arccos\frac{y(tr)}{y\text{max}}$$

and the actual frequency of the actual signal course can be estimated herefrom at great accuracy according to the relationship:

$$f(t) = \frac{1}{\pi\Delta t}\arccos\frac{y(tl,r)}{y\text{max}}$$

Hereby, an interpolation of the cosine function established as preferred trigonometric function is implemented from advantageously only three sampling values, namely the maximum value ($y_{max}$) and a sampling value ($y(t_{l,r})$) to the left and right near the maximum value. As the data volume to be processed is only comparably small, a particularly short processing time is required. The method is thus characterized in particular by a high processing speed. Instead of the cosine function, the formulation may in principle be based on the sine function as well.

Both sampling values lying chronologically before and after the maximum value have advantageously the same ordinate value or amplitude value. This is suitably ensured through use of a predetermined threshold value which, during sampling, has just been surpassed by the respective (left) sampling value while the respective (right) sampling value is just below thereof. In the further processing, the abscise values pertaining to both these sampling values and thus the corresponding time clocks are utilized, i.e. the respective time criteria or the respective time value of both these sampling values is assigned to the threshold value.

According to another aspect of the present invention, a device for detection of accidental arcs (arc tracking) on a cable, especially on a cable of an on-board electrical system of an aircraft, includes a current sensor for ascertaining an alternating current signal, guided through the cable, and an analog-to-digital converter which generates a number of time-discrete sampling values from the alternating current signal, as well as a function module which determines the actual alternating current frequency through evaluation of selected sampling values, and generates a warning signal when the actual alternating current frequency deviates from a desired frequency.

The advantages attained by the invention reside in particular in the fact that the actual alternating current frequency can be estimated by means of a respective algorithm through interpolation of suitably only three sampling values of a time-discretely alternating current signal, and an arc tracking on an on-board electrical system cable can be detected in a reliable and especially effective manner, when the actual alternating current frequency deviates from a desired or on-board system frequency. By using the discrete current signal preferably reduced by the factor ten in number which—in comparison to the signal course interpolated for the frequency estimation from only very few sampling values—comparably completely receives the information contained in the detected alternating current signal, the data connection for the entire signal processing and signal evaluation process is simplified. Hereby, the algorithm contains preferably two parallel program paths wherein the (first) program path provided for frequency estimation processes practically only three sampling values out of a deliberately high sampling rate provided for a desired fine resolution of the alternating current signal. A comparably small sampling rate would be sufficient for the actual signal path or (second) program path without significant information loss so that suitably the data rate to be processed there can be decreased through reduction of the number of sampling values of the discrete current signal.

A device operating according to this method is advantageously integrated in a protective switch for the electrical system of an aircraft so as to be configured in a simple and space-saving manner for detection and clearing of accidental arcs that are encountered on an electrical system cable. Hereby, the respective algorithm is implemented in a so-called ASIC (Application Specific Integrated Circuit) which is usable, in view of its small structural size, for this application in a conventional protective switch which demands especially small dimensions.

The device is therefore suitable in particular for detection of faulty arcs caused in voltage flashovers as a consequence of faulty installations. The device suitably installed permanently in the on-board electrical system of such an aircraft, that is the protective switch, expanded by this protective function, indicates therefore faulty arcs and switches off, optionally, selectively. As a result, at least the burning period of an developed arc is so reduced as to prevent secondary damages. The protective switch, expanded by this protective function, is thus suitable in particular also for retrofitting in already manufactured and/or duly utilized aircrafts or airplanes, which use conventional cable insulation. Such a retrofitting is especially appropriate for economical reasons as the typical service life of airplanes is currently 15 to 20 years.

BRIEF DESCRIPTION OF THE DRAWING

Exemplified embodiments of the invention will now be described in more detail with reference to a drawing in which.

DETAILED DESCRIPTION OF PREFERRED EMBODIMENTS

Figure 1:
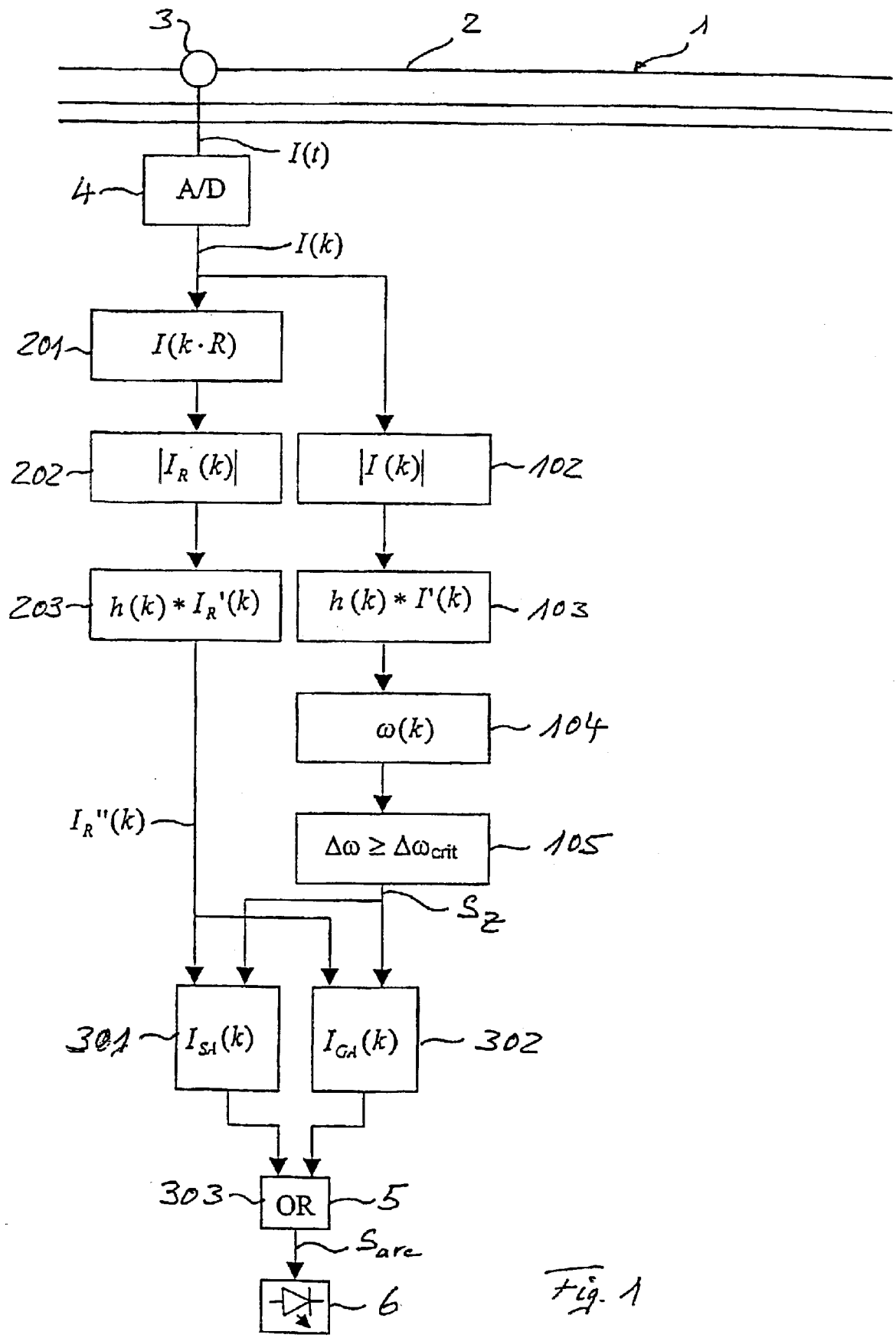
FIG. 1 is a block diagram to show the sequence of the process for arc detection in an on-board electrical system cable.

Throughout all the Figures, corresponding elements are generally indicated by same reference numerals.

The voltage $U_B$, used in the on-board electrical system of an aircraft or airplane, is normally 115 V at a system frequency f of 400 Hz. The respective time-continuous or analog alternating current signal with same frequency of 400 Hz can thus be described according to the cosine formulation in generic and undisturbed form, i.e. without superimposed disturbances by:

$$i(t) = \hat{i} \cdot \cos(\omega t - \phi) \quad (1)$$

wherein $\hat{i}$ is the amplitude, and $\phi$ is the phase of the current signal, and $\omega$ is the angular frequency, whereby $f = \omega/2\pi$ as system frequency or alternating current frequency.

Starting from this formulation, the current I(t) is ascertained according to FIG. 1 in the supply line 2 of the on-board electrical system or an electrical system cable 1 by means of a current sensor or current transformer 3. The ascertained current signal I(t) contains hereby—in addition to further disturbances—as superimposition also an arc signal as a result of an arc. The ascertained current signal I(t) is sampled by means of an analog-to-digital converter (A/D converter) 4 with a clock frequency f=1/T of e.g. 50 kHz. The A/D converter 4 has hereby a resolution of at least 12 bit, preferably 16 bit. At such a clock frequency f of 50 kHz, the current values (I(t) values) are sampled or read out every 0.02 ms, wherein $$I(k) = I(k \cdot T), \text{ with } k \in Z \quad (2)$$

This signal converted from the ascertained continuous current signal I(t) into the time-discrete signal I(kT) by means of the A/D converter 4 is processed and evaluated by means of the algorithm illustrated in FIG. 1. Hereby, the signal I(kT) is quasi rectified, i.e. the negative half wave appears as positive half wave, in a first program step 102 of a first program path through absolute-value generation according to the relationship:

$$I'(k) = |I(k)| \quad (3)$$

In a subsequent program step 103, the signal I'(k) is smoothed through a digital filter operation with the transfer function $$H(z) = \frac{1}{N} \sum_{k=0}^{N-1} z^{-k} \quad (4a)$$

and the impulse response $$h(k) = \{1/N, k=0 \rightarrow N-1\} h(k) = \{0, \text{otherwise}\} \quad (4b)$$

This causes a processing of the signal I'(k) according to the convolution or filtering operation $$I''(k) = h(k) * I'(k) = \frac{1}{N} \sum_{i=0}^{N-1} I'(k-i) \quad (4c)$$

wherein N=9, when the respective average value is formed from 10 sampling values. N indicates thus the respective width of the window of the digital filter. Moreover, k corresponds to the actual time point, while i indicates the values trailing in time. The digital filter and the digital filter operation run therefore in the past, i.e. in causal direction.

In a second, parallel program path, the time-discrete signal I(k) passes through a low pass filter in a first program step 201, whereby the number of sampling values is reduced by, e.g., the factor R=10, once filtering has occurred, according to the relationship:

$$I_R(k) = I(k \cdot R) \quad (5)$$

In the following program steps 202 and 203 of this program path, again an absolute-value generation of the reduced signal $I_R(k)$ is realized—in analogy to the program steps 102 and 103—with the result $I'_R(k)$, wherein $$I'_R(k) = |I_R(k)| \quad (6)$$

Subsequently, the signal $I'_R(k)$ is again smoothed according to the relations 4a to 4c with the output signal:

$$I''_R(k) = \frac{1}{N} \sum_{i=0}^{N-1} I'_R(k-i) \quad (7)$$

This signal $I''_R(k)$ is transmitted to a module or program step 301 to evaluate a single arc signal or arc pulse $I_{SA}(k)$ as well as to a program step 302 for evaluation of a number or group $I_{GA}(k)$ of arc signals.

In the first program path, the actual frequency of the signal I"(k) is determined in the program step 104 according to the general relation:

$$2\pi f(k) = \omega(k) = \frac{2}{\Delta T} \arccos \frac{y(kl, r)}{y(k\max)} \quad (8)$$

and according to the complete relation:

$$\omega(k) = \frac{1}{T} \frac{(kr - k\max) \cdot \arccos \gamma r + (k\max - kl) \arccos \gamma l}{(kr - k\max)^2 + (k\max - kl)^2} \text{ with} \quad (9)$$

$$\gamma r = \frac{y(kr)}{y(k\max)}, \quad \gamma l = \frac{y(kl)}{y(k\max)}, \quad (10)$$

wherein y(k) corresponds to the output signal I"(k).

Figure 2:
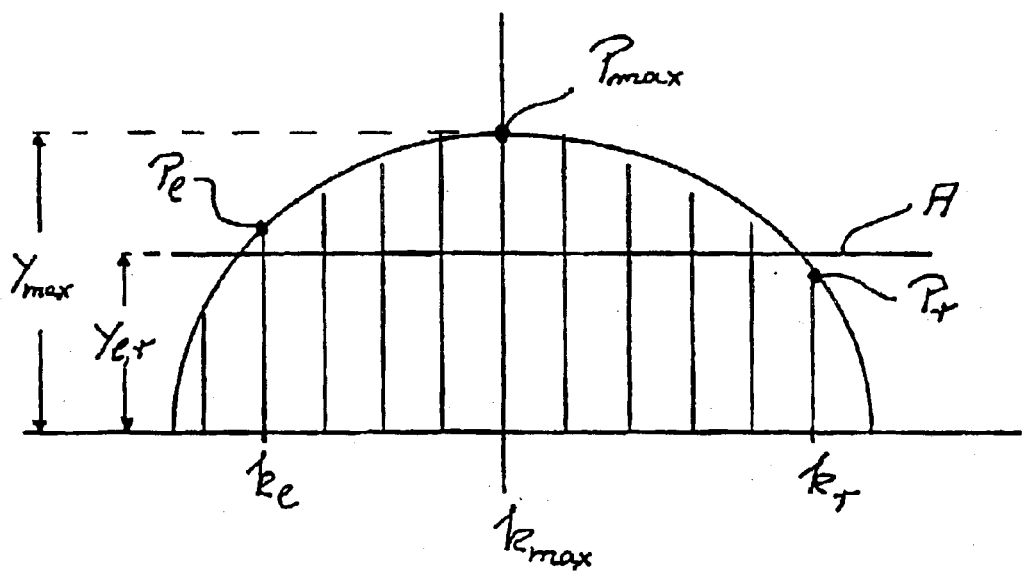
FIG. 2 is a schematic illustration for explanation of the measuring and evaluation principle.

According to this relation (9), the actual frequency $\omega(k)$ of the time-discrete signal I(kT) and thus the measured current course I(t) can be ascertained in view of the preset and thus known sampling time T and sampling rate f=1/T from the sampling values $y(k_l)$, $y(k_r)$—and $y(k_{max})$—and $I''(k_l)$, $I''(k_r)$ and $I''(k_{max})$, respectively,—at the respective sampling points or time clocks $k_r$, $k_l$ and $k_{max}$, respectively. Hereby, the cosine function is interpolated of three points or sampling values as this will be described in more detail with reference to FIG. 2.

At the basic sampling time of 0.02 ms and an electrical system frequency of 400 Hz, there are 125 sampling values or value pairs (k,y(k)) per signal period. The actual signal I(k) can thus be established by:

$$I(k) = I(k_{max}) \cdot \cos[(k - k_{max})\omega T] \quad (11)$$

wherein $\omega$ is the actual frequency. Estimation of the actual frequency $\omega$ is realized on the basis of only three points:

$$P_l = (k_l, y(k_l))$$

$$P_{max} = (k_{max}, y(k_{max}))$$

$$P_r = (k_r, y(k_r))$$

When using less than three points, a variable, e.g., the amplitude I(t) or the phase $\phi$, required for a complete description of the cosine function (1), has to be derived from another operation.

The points $P_l$ and $P_r$ can be determined by advantageously predetermining a threshold value A and using the respective time or k-value $k_l$, $k_r$ of the respective subsequent sampling value, when the threshold value is surpassed and dropped below in a time-staggered manner, while the threshold value A is respectively used as pertaining amplitude or y-value $y(k_l)$, $y(k_r)$, so that the following governs:

$$y(k_l) \approx A, \; y(k_r) \approx A \tag{12}$$

The threshold value A may hereby be matched also to the respective maximum current $I_{max}(t)$ by adjusting the threshold value A in a respective program step automatically e.g. to 10% to 70% of the maximum current I(t) and thus to a nominal current dependent on the line cross section typically monitored by a protective switch. Suitable is also frequency detection in a respective program step, in particular when the alternating current frequency or on-board system frequency is variable. A frequency detection of the actual frequency ω may, for example, be realized before the first program step 102 and before or after the sampling of the measuring or current signal (I(t) by means of a PLL (Phase Looked Loop).

This actual frequency ω (k) ascertained from the time-discrete current signal I(k) is compared in the program step 105 with a threshold value $\Delta\omega_{crit}$, e.g. 50 Hz, which represents a critical frequency ω (k), whereby the following governs:

$$\Delta\omega = |\omega - \omega'| \tag{13}$$

The frequency ω(k) represents hereby half the alternating current frequency and on-board system frequency (f/2=200 Hz). If $\Delta\omega \geq \Delta\omega_{crit}$, an arc flag in the form of a state signal $S_Z$ is generated in the program step 105 for transfer to the program step 301 as well as also to the program step 302. The state signal $S_Z$ is high ($S_Z=1$), when the frequency ω(k) ascertained from the actually detected current path I(k) surpasses the threshold value. Otherwise, the state signal $S_Z$ is low ($S_Z=0$).

While almost all information of the processed signal I(k) remains contained in the second program path with the program steps or function modules 201 to 203 with the reduced discrete current signal $I_R(k)$, the first program path with the program steps or function modules 102 to 105 utilize only the information of the signal I(k), required for the frequency estimation. Therefore, the pulse rate to be processed in the first program path is especially easy to manage. Processing of the reduced pulse rate in the second program path is also comparably easy to manage with respect to the original discrete current signal I(k), whereby this program or signal path allows in addition a sufficiently precise evaluation of the information contained in the complete signal according to (11), in particular with respect to several signal amplitudes $y(k_{max})$.

Figure 3:
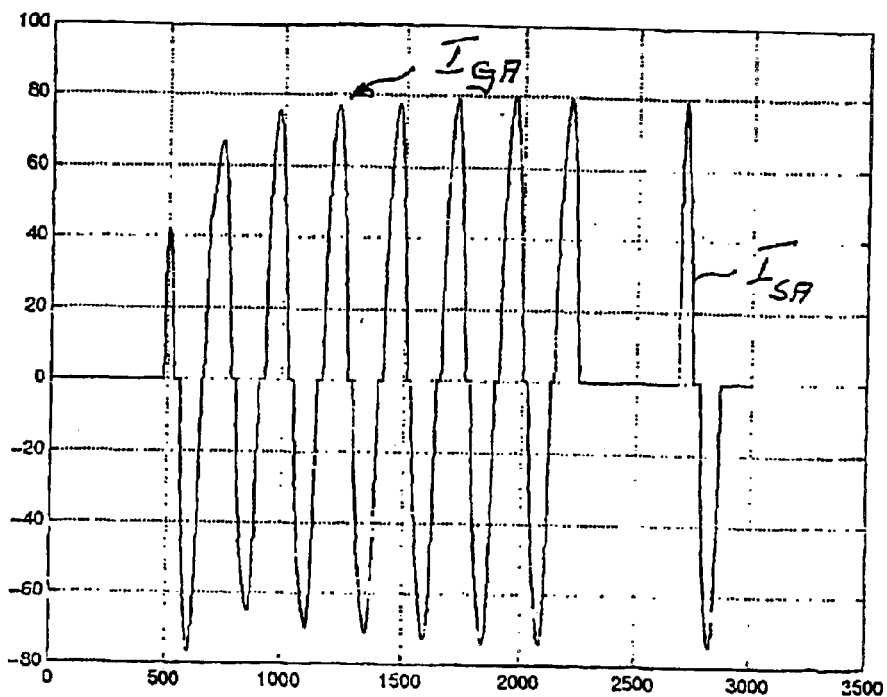
FIG. 3 is an illustration of the signal course of an arc signal group and of a single arc signal.

The individual arc signals $I_{SA}(k)$ are determined only in the program step 301 and analyzed, while an arc signal group $I_{GA}(k)$ is determined and analyzed in the program step 302. FIG. 3 shows a typical arc signal profile of an arc signal group $I_{GA}(k)$ (left) and a single arc signal $I_{SA}(k)$ (right).

The program step 301 examines on the basis of the signal $I_R''(k)$, reduced in the sampling rate, of the program step 203 and the state signal $S_Z$ of the program step 105, whether at least L half waves of the signal $I_R''(k)$ are within a given time window. Hereby, the signal $I_R''(k)$ is differentiated, i.e. its gradient is determined according to the relation:

$$grad(k) = I_R''(k) - I_R''(k-1) \tag{14}$$

If $S_Z=1$ and $grad(k) > grad_{max}$, so that the value grad(k) surpasses a threshold value, the respective half waves of the signal $I_R''(k)$ is viewed as potential arc signal and a counter is increased. If the counter value is within the time window above L, the program step 301 generates a warning signal, e.g. high or 1, which warning signal represents arc detection. The warning signal is fed to an OR operation (program step 303) or to a logic OR element 5 which delivers a warning signal $S_{arc}$ to a display element 6, for example in form of a light-emitting diode (LED).

Figure 4:
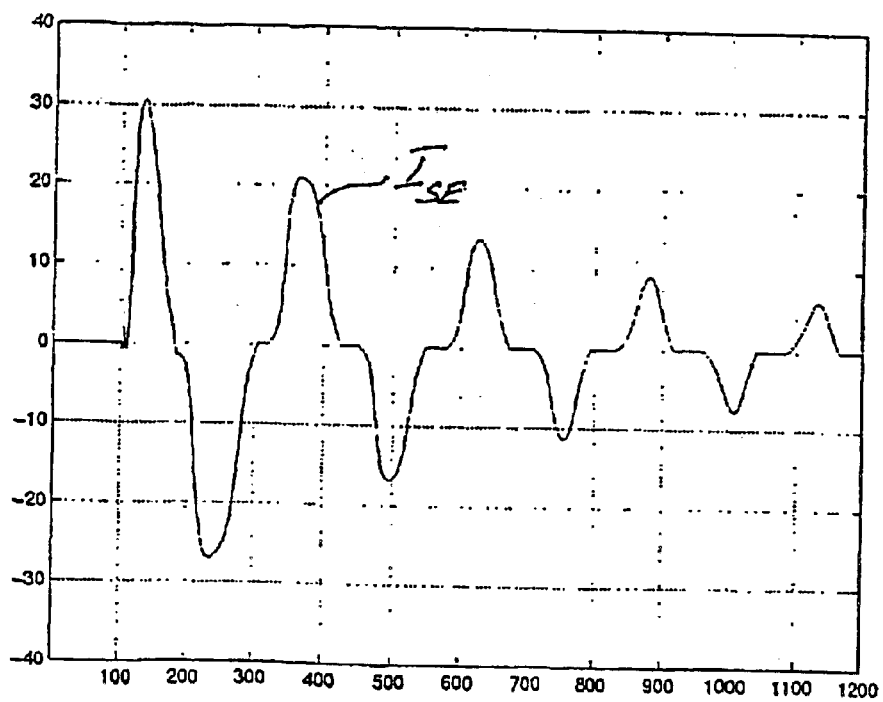
FIG. 4 is an illustration of a typical signal course as a result of a switching event.

In program step 302, a group $I_{GA}(k)$ of arc signals is compared with a possibly (simultaneously) occurring spurious signal course as a consequence of a switching event on the consumer's end, whose typical signal pattern ISE is shown in FIG. 4. Although such an spurious, signal $I_{SA}$, caused as a consumer connected via this electrical system cable 1 or a load is switched on or off, shows a similar signal pattern as the arc signals $I_{GA}(k)$. However, as it is generally known, such an spurious signal $I_{SA}$ fades away after an exponential function, which is not the case of a typical arc signal group $I_{GA}(k)$.

On the basis of or as a consequence of the fade away behavior, such a spurious signal as a result of switching events can therefore be distinguished from a typical arc signal group $I_{GA}(k)$. Hereby, the maxima of all half waves of the signals of the arc signal group $I_{GA}(k)$, whose frequency ω are above the critical frequency ω', is initially ascertained. Subsequently, M sequential maxima are added as well as the maximum of the M values is determined and the mean value is formed. When a predetermined fraction, e.g. 90% of the mean value, has been reached, arc tracking is recognized and the program step 302 delivers again a warning signal, e.g. high or 1, representing arc detection. The warning signal is supplied to the OR operation (program step 303) which generates the warning signal $S_{arc}$ for the display element 6 or for a protective switch function (FIG. 5).

Figure 6:
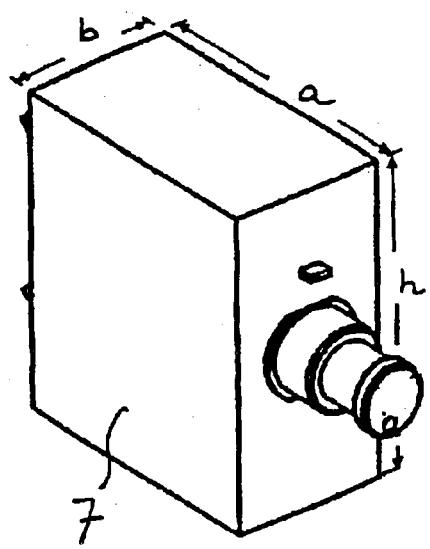
FIG. 6 is a perspective overall view of the protective switch.

The entire program function is preferably integrated in an ASIC (Application-Specific Integrated Circuit) which, in turn, is used as integral component in a protective switch 7 according to FIG. 6, typically provided in the aircraft or spaceship. The dimensions of the protective switch 7 are suited to the typical demands in this application, namely aircraft and spaceships, and amount to about a=50 mm, h=40 mm and b=20 mm.

Figure 5:
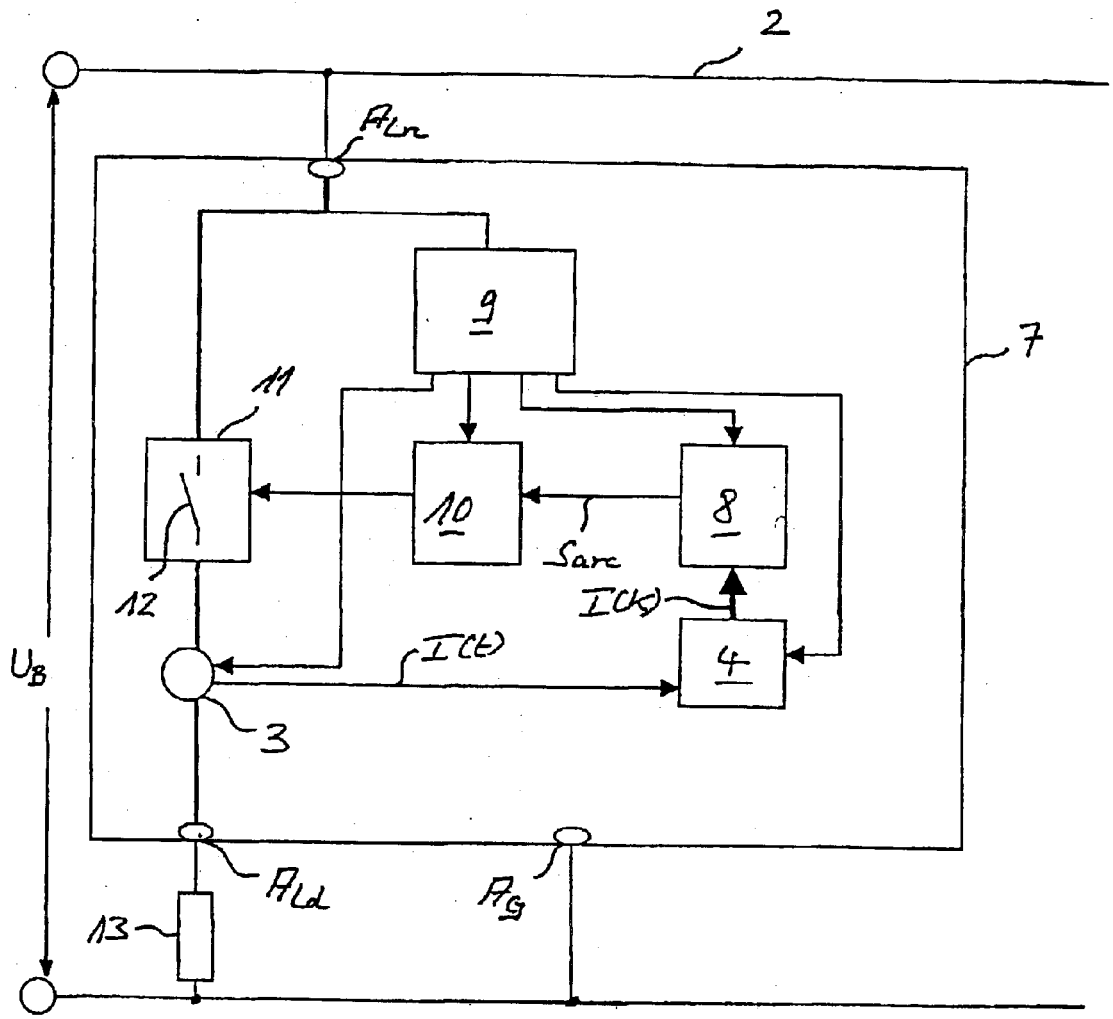
FIG. 5 is a block diagram of a protective switch in which the algorithm for carrying out the method is implemented.

FIG. 5 shows the functional modules of such a protective switch 7 with integrated analog-to-digital-converter 4 and ASIC function module 8, in which the algorithm, shown in FIG. 1 and operating according to the method described herein, is permanently inputted and implemented. A power pack 9 delivers the supply current or the supply voltage for the function module 8 and for the A/D converter 4, disposed upstream, as well as for the also integrated current sensor 3 and a remote trigger module 10 for remote triggering in the form of a trip coil. The latter is coupled with a protective switch function 11, in particular with at least one trigger, a switch latch and a switching contact 12. The switching contact 12 is disposed between a LINE terminal $A_{Ln}$ and a LOAD terminal $A_{Ld}$ of the additional protective switch 7 which has also a ground terminal $A_G$.

When the protective switch 7 is connected to the supply line 2 of the on-board electrical system or the electrical system cable 1, the current sensor 3 detects the current signal I(t), which, when the switching contact 12 is closed, is directed across the protective switch function 11 to an actuator, a sensor and thus to a on-board consumer or generally to load 13 of the electrical system 1. The current signal I(t) is processed for detection of arc signals (arc tracking), as a consequence of an arc occurring along the electrical system cable 1, within the protective switch 7 by means of the A/D converter 4 and the FPGA module 8. The latter generates in case of the described detection of an arc tracking the warning signal $S_{arc}$ which is transferred to the display 6 and/or to the remote trigger module 10. The latter delivers a trigger signal $S_A$ to the protective switch function 11, effective in particular as line protection, for opening the switching contact 12 so as to cut the respective load 13 from the supply line 2 and thus the on-board electrical system 1.

The protective switch 7 ensures therefore in addition to the conventional overcurrent protection in the on-board electrical system of such an aircraft an expanded protection also against accidental arcs so that the existing on-board installations are reliably protected.

What is claimed is:

1. A method for detecting accidental arcs (arc tracking) on a cable, in particular on a cable of an on-board electrical system of an aircraft or spacecraft, said method comprising the steps of:

sampling an ascertained alternating current signal time-discretely to generate a discrete current signal;

determining from the discrete current signal through interpolation of a number of sampling values a trigonometric function, which imitates an alternating current course;

deriving an actual alternating current frequency from the trigonometric function; and comparing the actual alternating current frequency with a desired frequency to determine the presence of an accidental arc, wherein the actual alternating current frequency is derived from the number of sampling values by using a maximum sampling value and a first sampling value lying in time before the maximum sampling value and a second sampling value lying in time after the maximum value.

2. The method of claim 1, wherein the number of sampling values is three.

3. The method of claim 1, and further comprising the step of assigning a same y-value to the first and second sampling values.

4. The method of claim 1, and further comprising the step of providing a threshold value which is assigned as the y-value, whereby the first sampling value surpasses the threshold value, and the second sampling value falls below the threshold value.

5. The method of claim 1, wherein the actual alternating current frequency is determined algorithmically according to a frequency function:

$$\omega(k) = \frac{1}{T} \frac{(kr - k\max) \cdot \arccos\gamma r + (k\max - kl)\arccos\gamma l}{(kr - k\max)^2 + (k\max - kl)^2} \text{ with}$$

$$\gamma r = \frac{y(kr)}{y(k\max)}, \quad \gamma l = \frac{y(kl)}{y(k\max)},$$

wherein 1/T is a clock frequency and $k_l$, $k_{max}$, $k_r$, are time clocks (k·T) of the sampling values, and $k_l$ is associated to an amplitude value $y(k_l)$ which is the first sampling value, $k_{max}$ is associated to an amplitude value $y(k_{max})$ which is the maximum sampling value, and $k_r$ is associated to an amplitude value $y(k_r)$ which is the second sampling value.

6. The method of claim 1, and further comprising the step of using the discrete current signal for input in two processing paths, with a first one of the processing paths being a reduction path to generate a reduced discrete current output signal through algorithmic steps, and with a second one of the processing paths being a frequency comparison path to generate a state signal through algorithmic steps.

7. The method of claim 6, wherein the discrete current signal has an absolute value to produce an absolute value discrete current signal in the frequency comparison path.

8. The method of claim 7, and further comprising the steps of processing the absolute value discrete current signal in the frequency comparison path through a digital filter according to the convolution operation:

$$I''(k) = h(k) * I'(k) = \frac{1}{N} \sum_{i=0}^{N-1} I'(k-i)$$

wherein N is a window width of the digital filter and h(k) is a pulse response resultant therefrom, and wherein h(k)=1/N for k=0 to N−1 and otherwise h(k)=0, and producing therefrom an output discrete current signal.

9. The method of claim 8, and further comprising the steps of comparing the actual alternating current frequency against a critical threshold value to determine the value of the state signal in the frequency comparison path.

10. The method of claim 6, and further comprising the steps of reducing the discrete current signal in the number of sampling values to generate a reduced discrete current signal, and generating an absolute value reduced discrete current signal in the reduction path from the reduced discrete current signal.

11. The method of claim 10, and further comprising the steps of processing the absolute value reduced discrete current signal in the reduction path through a digital filter according to the convolution operation:

$$I''_R(k) = h(k) * I'_R(k) = \frac{1}{N} \sum_{i=0}^{N-1} I'_R(k-i)$$

wherein N is a window width of the digital filter and h(k) is a pulse response resultant therefrom, and wherein h(k)=1/N for k=0 to N−1 and otherwise h(k)=0 and generating a reduced discrete current output signal.

12. The method of claim 6, and further comprising the step of evaluating from the state signal of the frequency comparison path, and from the reduced discrete current output signal of the reduction path, a formation of at least one of individual accidental signals and an accidental signal group, as a consequence of an arc.

13. The method of claim 1, and further comprising the steps of generating a warning signal, when an accidental arc is detected, and triggering a protective switch to cut a lad from the cable.

14. The method of claim 1, and further comprising the step of distinguishing a detected arc signal group by its fade away behavior from a spurious signal, caused by a switching event.

* * * * *